United States Patent
Hontake et al.

(10) Patent No.: US 8,163,469 B2
(45) Date of Patent: Apr. 24, 2012

(54) COATING AND DEVELOPING APPARATUS, COATING AND DEVELOPING METHOD, AND STORAGE MEDIUM

(75) Inventors: Kouichi Hontake, Koshi (JP); Hideharu Kyouda, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 226 days.

(21) Appl. No.: 12/659,134

(22) Filed: Feb. 26, 2010

(65) Prior Publication Data

US 2010/0232781 A1     Sep. 16, 2010

(30) Foreign Application Priority Data

Mar. 13, 2009 (JP) .................. 2009-061657

(51) Int. Cl.
- *H01L 21/00* (2006.01)
- *G03C 5/56* (2006.01)
- *G03C 11/00* (2006.01)

(52) U.S. Cl. .................. 430/394; 430/422; 438/800
(58) Field of Classification Search .................. 355/27, 355/30; 430/394, 422

See application file for complete search history.

(56) References Cited

FOREIGN PATENT DOCUMENTS

| JP | A-02-009476 | 1/1990 |
|---|---|---|
| JP | A-07-106233 | 4/1995 |
| JP | A-2005-175079 | 6/2005 |
| JP | A-2007-165869 | 6/2007 |
| JP | A-2007-194503 | 8/2007 |
| JP | A-2007-214279 | 8/2007 |
| JP | A-2007-220989 | 8/2007 |

OTHER PUBLICATIONS

Office Action mailed on Apr. 19, 2011 issued from the Japanese Patent Office in the corresponding Japanese patent application No. 2009-061657 (English Translation enclosed).

Office Action mailed on Apr. 19, 2011 issued in the corresponding Japanese Patent Application No. 2009-051174 (English Translation Enclosed).

*Primary Examiner* — Evan Pert

(74) *Attorney, Agent, or Firm* — Posz Law Group, PLC

(57) ABSTRACT

A coating and developing apparatus has: a treatment block-including a water repellent module performing water repellent treatment on a substrate, a coating module, and a developing module; a substrate side-surface portion water repellent module for performing water repellent treatment on a side surface of a substrate; and a control unit controlling operations of the modules to execute steps of performing water repellent treatment at least on a side surface portion of a substrate and performing a first resist coating on an entire surface of the substrate; performing a first development after a first liquid-immersion exposure is performed; performing a second resist coating on the entire surface, and performing a second development after a second liquid-immersion exposure is performed, and further to execute a step of performing water repellent treatment on the side surface portion of the substrate after the first development and before the second exposure is performed.

4 Claims, 21 Drawing Sheets

COATING AND DEVELOPING APPARATUS, COATING AND DEVELOPING METHOD, AND STORAGE MEDIUM

BACKGROUND OF THE INVENTION

1. Field of the Invention

The present invention relates to a coating and developing apparatus, a coating and developing method, and a storage medium.

2. Description of the Related Art

In a photolithography process that is one of semiconductor manufacturing processes, a resist is applied to the front surface of a semiconductor wafer (hereinafter, referred to as a "wafer"), the resist is exposed into a predetermined pattern and then developed, thereby forming a resist pattern. Such treatments are usually performed generally using a system in which an aligner is connected to a coating and developing apparatus performing coating and development of the resist.

Recently, to form a fine resist pattern, liquid-immersion exposure is sometimes performed in the aligner. To briefly describe, the liquid-immersion exposure is an exposure method of repeating operations of forming a solution film 12 composed of, for example, pure water between an exposure lens 11 of an exposure device 10 and a wafer W as shown in FIG. 16A, moving the exposure device 10 in a lateral direction as shown in FIG. 16B so that the exposure device 10 is located at a position corresponding to a next transfer region (shot region) 11A, and applying light, to thereby transfer a predetermined circuit pattern to a resist film 14. Numerals 13A and 13B in the drawings respectively denote a solution supply path and a drainage path for forming the solution film 12. Further, in FIG. 16B, the transfer region 11A is illustrated larger than the real size.

A side end surface of the wafer W and upper and lower inclined surfaces adjacent to the side end surface are called a bevel portion, and the pure water constituting the solution film 12 can adhere to the bevel portion and run from the bevel portion to a rear surface of the wafer W during the liquid-immersion exposure. The liquid adhered to the bevel portion that is the side surface portion of the wafer W and run to a peripheral edge portion on the rear surface side becomes dried into particles and can contaminate the wafer W. Hence, a gas containing, for example, HMDS (hexamethyldisilazane) is supplied, before a resist is applied to the wafer W, to the front surface and the bevel portion of the wafer W to perform water repellent treatment (hydrophobic treatment) so as to prevent the pure water from adhering to the bevel portion and running from the bevel portion to the rear surface of the wafer W.

Incidentally, use of a technique called double patterning is being discussed in order to make the line width of the resist pattern finer. To briefly describe the procedure of the double patterning referring to FIG. 17 that is a flowchart showing an example thereof, the already-described water repellent treatment on the front surface and the bevel portion of the wafer W, a resist coating treatment for the first time, a heat treatment (PAB treatment) for removing a solvent component in the resist, a cleaning treatment on the wafer W before exposure, an exposure processing for the first time, a heat treatment (PEB treatment, but not shown) for accelerating a chemical reaction after exposure, and a developing treatment for the first time are performed in this order to form a resist pattern 15 composed of recessed portions 15a and projecting portions 15b as shown in FIG. 18A. After the development, a heat treatment (post-baking treatment) for removing water due to the developing treatment is performed.

Thereafter, a resist coating treatment for the second time is performed to form a new resist film 17, and a heat treatment and a pre-exposure cleaning treatment are performed in order, and exposure processing for the second time is performed to expose the wafer W such that the exposure region is shifted from that of the exposure processing for the first time. Thereafter, a developing treatment for the second time is performed to form a resist pattern 16 as shown in FIG. 18B, and a heat treatment is performed. The wafer W is then carried to an etching apparatus and is etched using the resist pattern 16 as a mask. As described above, photolithography is performed twice in the double patterning, in which a resist pattern finer and denser than a resist pattern formed by a single photolithography is formed.

Depending on a semiconductor device, it is demanded to form a resist pattern having a size ratio between a line width L1 of a recessed portion 16a and a line width L2 of a projecting portion 16b constituting the resist pattern 16 being 1:1 as shown in FIG. 18B in a manufacturing process of the semiconductor device. By employing the double patterning, the projecting portion 16b can be formed after the development for the second time, in the recessed portion 15a of the pattern 15 which has been formed after the development for the first time as described above. Therefore, if the aligner has a performance capable of forming a resist pattern having a size ratio between the line width of the recessed portion and the line width of the projecting portion being 3:1, the aligner can form the resist pattern having a ratio of L1:L2=1:1. Accordingly, it is possible to make the pattern having a ratio of L1:L2=1:1 finer without changing the aligner, and the above described technique is therefore particularly advantageous to form a resist pattern having the above-described ratio.

Incidentally, the study of the contact angles before and after a developing treatment on a wafer which had been treated with WADS, as shown in the later-described reference test, revealed that the contact angle after the development decreased as compared to the contact angle before the development, that is, the effect of the water repellent treatment with HMDS decreased due to contact with the developing solution to decrease the water repellency of the wafer W. This causes a concern that when performing the above-described double patterning using the aligner performing the liquid-immersion exposure, the adhesion of the pure water to the bevel portion can be prevented as shown in FIG. 19A because the bevel portion has a high water repellency at the exposure for the first time, but adherence of the pure water to the bevel portion and running of the pure water to the rear surface of the wafer W occur as shown in FIG. 19B because the water repellency of the bevel portion of the wafer W is decreased at the exposure for the second time, thereby causing particles as already described.

For example, Japanese Patent Application Publication Nos. 2005-175079 and 2007-214279, in which the technique of hydrophobizing the peripheral edge portion of the wafer W is described but performance of the above-described double patterning is not described, are insufficient to solve the problem in the double patterning.

SUMMARY OF THE INVENTION

The present invention has been made in consideration of the above circumstances, and an object thereof is to provide a coating and developing apparatus, a coating and developing method, and a storage medium each capable of preventing contamination of a substrate by particles in the coating and developing apparatus for forming a resist pattern a plurality of times in succession on a substrate.

The coating and developing apparatus according to the present invention is a coating and developing apparatus for forming a resist pattern a plurality of times in succession on a substrate, including:

a carrier block into/from which a carrier housing a plurality of substrates is carried;

a treatment block treating a substrate taken out of the carrier, the treatment block including a water repellent module performing water repellent treatment on a substrate, a coating module applying a resist to a substrate, a developing module performing development by supplying a developing solution to a substrate which has been subjected to liquid-immersion exposure, and a substrate carrier device carrying a substrate between the modules;

an interface block delivering a substrate between the treatment block and an external aligner performing liquid-immersion exposure on the resist;

a substrate side-surface portion water repellent module for performing water repellent treatment on a side surface of a substrate; and a control unit controlling operations of the substrate carrier device and the modules to execute steps of performing water repellent treatment at least on a side surface portion of a substrate in the water repellent module and performing a first resist coating on an entire surface of the substrate in the coating module; performing a first development in the developing module after a first liquid-immersion exposure is performed in the aligner; then performing a second resist coating on the entire surface in the coating module, and performing a second development in the developing module after a second liquid-immersion exposure is performed in the aligner, and further to execute a step of performing water repellent treatment on the side surface portion of the substrate after the first development and before the second exposure is performed.

According to the present invention, in a coating and developing apparatus for forming a resist pattern a plurality of times in succession on a substrate, a substrate side-surface portion water repellent module for performing water repellent treatment on a side surface portion of a substrate after the completion of a first development and before a second liquid-immersion exposure is performed is provided. Accordingly, it is possible to prevent the liquid used in the liquid-immersion exposure from adhering to the side surface portion and running to the rear surface of the substrate via the side surface portion during the second liquid-immersion exposure. As a result, occurrence of particles from the liquid is suppressed, so that a reduction in yield due to contamination of the substrate with the particles is suppressed.

DETAILED DESCRIPTION OF THE INVENTION

First Embodiment

Figure 1:
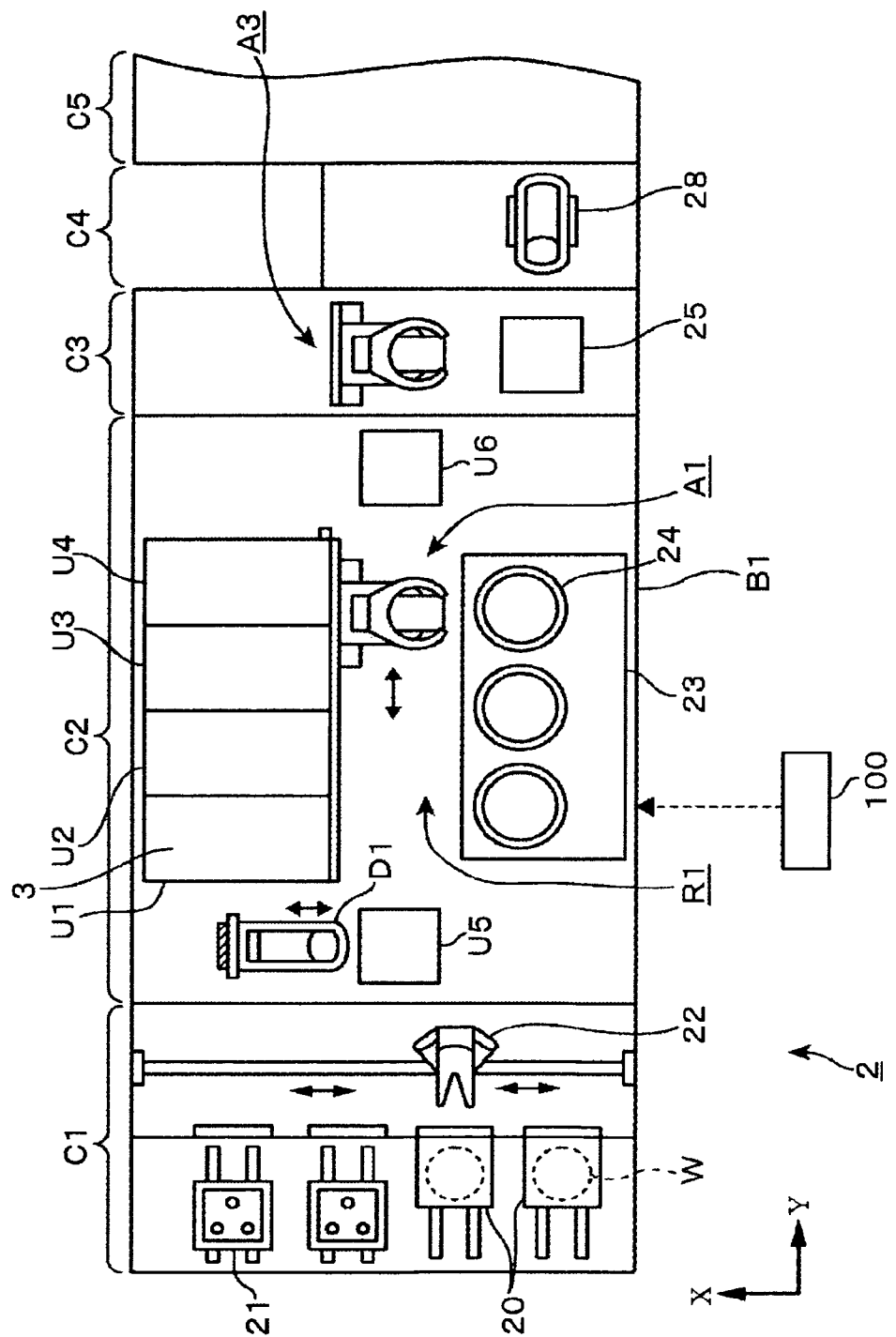
FIG. 1 is a plan view of a coating and developing apparatus according to an embodiment of the present invention.
Figure 2:
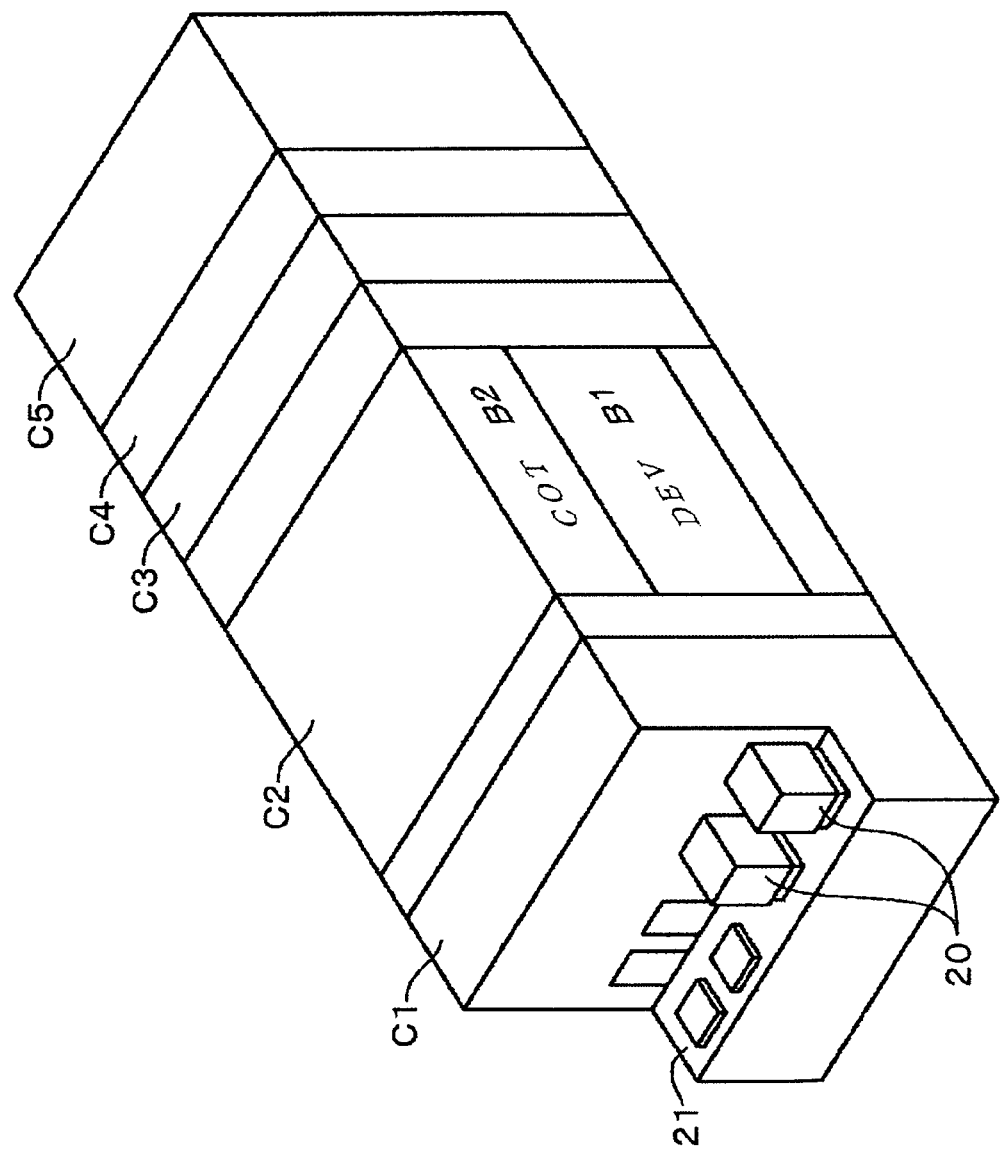
FIG. 2 is a perspective view of the coating and developing apparatus.
Figure 3:
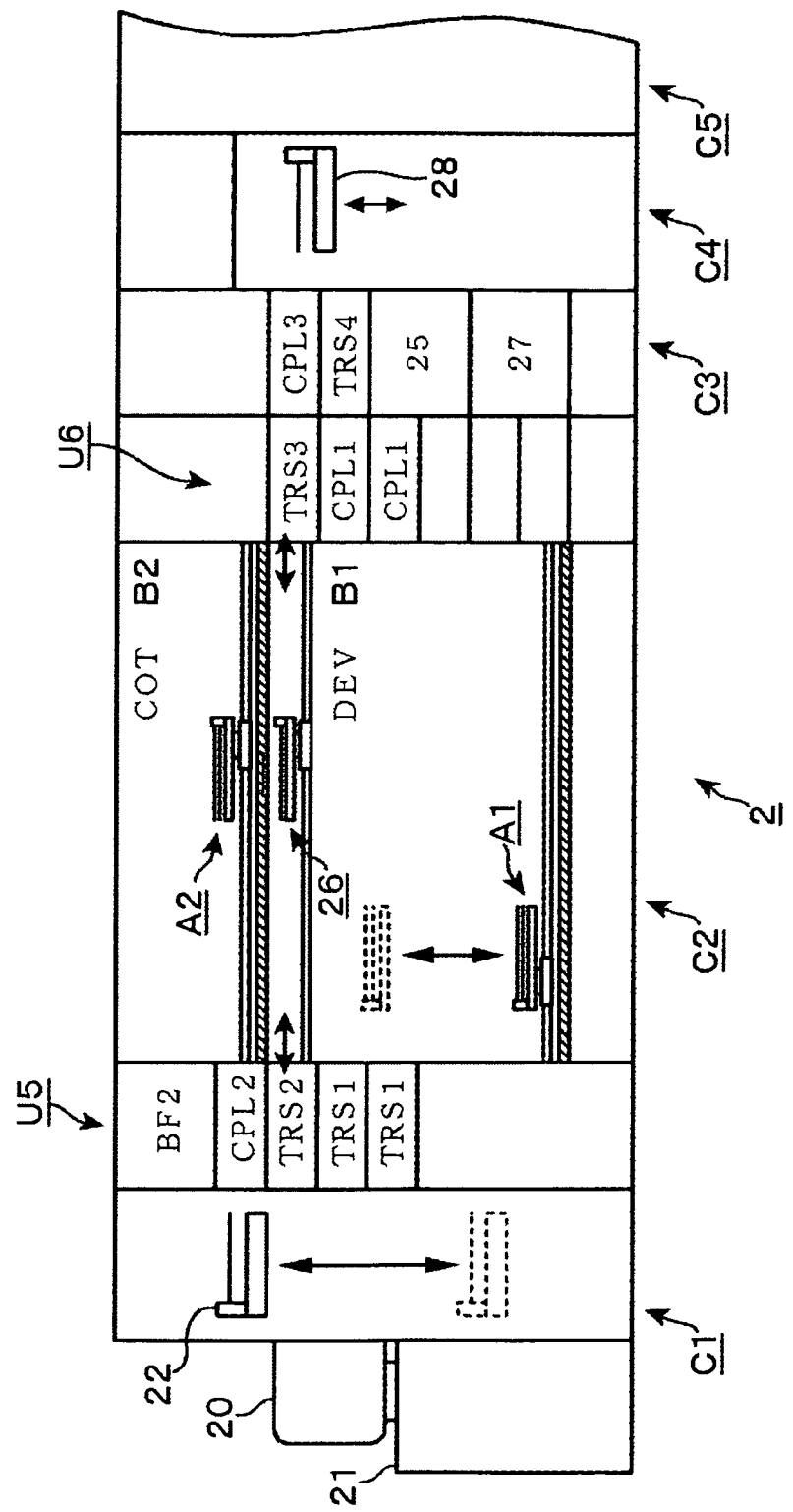
FIG. 3 is a longitudinal side view of the coating and developing apparatus.

FIG. 1 is a plan view of a resist pattern forming system in which an aligner C5 is connected to a coating and developing apparatus 2, and FIG. 2 is a perspective view of the system. Further, FIG. 3 is a longitudinal sectional view of the system. In the coating and developing apparatus 2, a carrier block C1 is provided and is structured such that a delivery arm 22 takes a wafer W out of a closed-type carrier 20 mounted on a mounting table 21 and delivers the wafer W to a treatment block C2, and the delivery arm 22 receives a treated wafer W from the treatment block C2 and returns the wafer W to the carrier 20.

As shown in FIG. 2, the treatment block C2 is composed of a DEV layer B1 that is a first block for performing developing treatment, a COT layer B2 that is a second block for performing coating of a resist on the entire surface of the wafer, which are tiered in order from the bottom in this embodiment.

Figure 4:
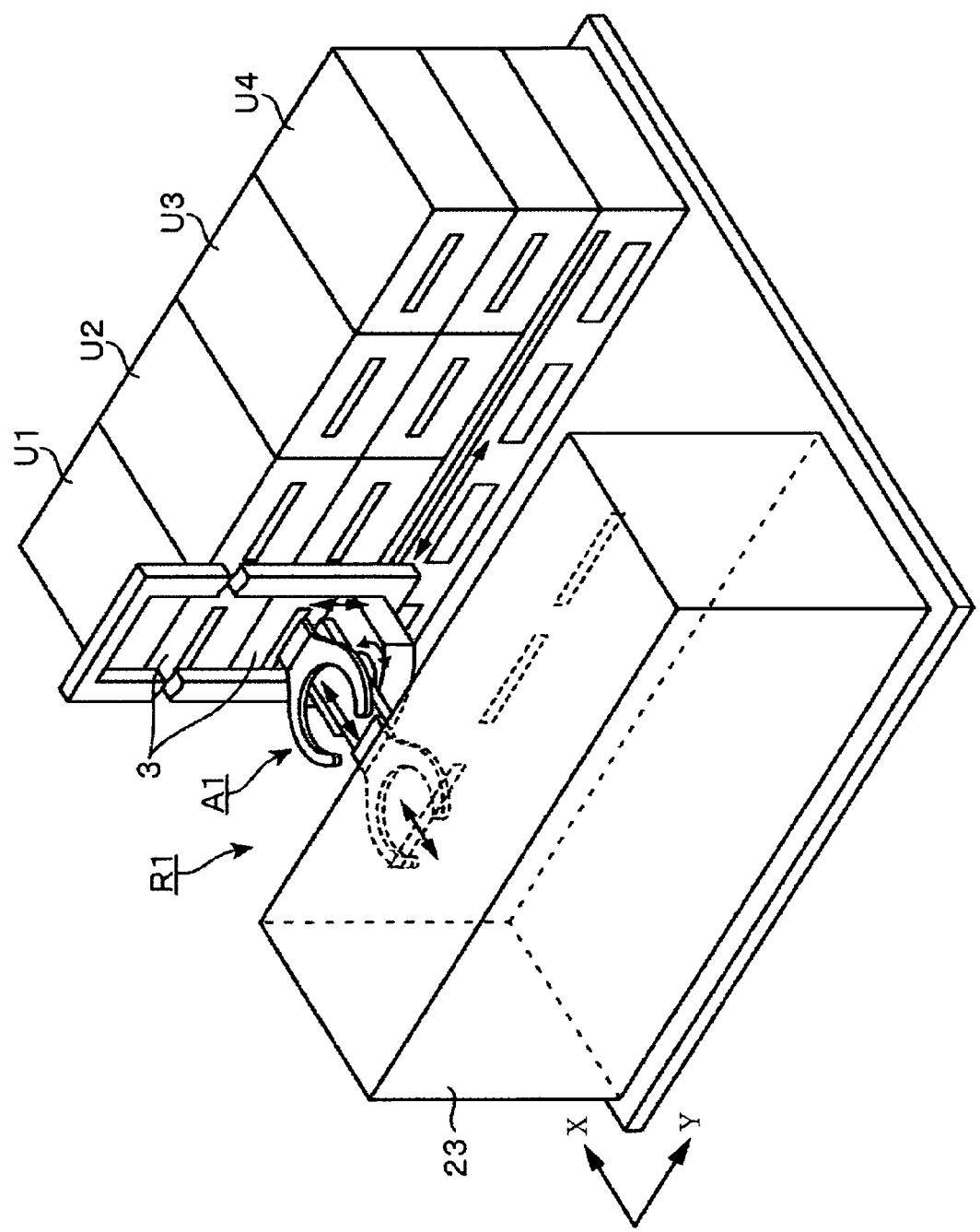
FIG. 4 is a perspective view of a treatment block of the coating and developing apparatus.

The first and second blocks B1 and B2 are similarly structured in plan view. To describe the first and second blocks B1 and B2 taking the DEV layer B1 shown in FIG. 1 as an example, developing modules 23 are two-tiered in one DEV layer B1. Each of the developing modules 23 includes three developing treatment units 24 and a casing that surrounds the developing treatment units 24 and is common to the developing treatment units 24. Further, in the DEV layer B1, shelf units U1 to U4 constituting a treatment unit group of a heating and cooling system for performing pre-treatment and post-treatment of the treatment performed in the developing module 23 are provided. FIG. 4 is a perspective view showing the developing module 23 at the lower tier side of the DEV layer B1 and modules provided at positions opposite the developing module 23 and constituting the shelf units U1 to U4.

As shown in FIG. 3, a carrier arm A1 as a substrate carrier device is further provided in the DEV layer B1, and the carrier arm A1 carries the wafer W between the developing modules at two tiers and the treatment modules of the heating and cooling system. In short, the carrier arm A1 is made common to the developing modules at two tiers.

Each of the heating modules constituting the shelf units U1 to U4 of the DEV layer B1 includes a heating plate heating the wafer W mounted thereon. The heating modules include heating modules for performing the above-described PEB and heating modules 3 as post-development heating modules performing the above-described post-baking after developing treatment. In this example, the heating modules performing PEB are provided in the shelf unit U4 and the heating modules 3 performing post-baking are provided in the shelf unit U1. The heating module 3 will be described later in detail. Further, each of the cooling modules constituting the shelf units U1 to U4 includes a cooling plate cooling the wafer W mounted thereon.

To describe the COT layer B2 mainly about the different points from the DEV layer B1, the COT layer B2 is composed of a coating module for forming a resist film as a coating film, shelf units U1 to U4 constituting a treatment module group of a heating and cooling system for performing pre-treatment and post-treatment of the treatment performed in the coating module, and a carrier arm A2 that is provided between the coating module and the treatment module group of the heating and cooling system and delivers the wafer W between them. The coating module is a module corresponding to the developing module 23, but is not tiered, unlike the developing modules 23, in this example. Accordingly, three treatment units each forming the resist film are provided in the COT layer B2.

The shelf units U1 to U4 provided in the COT layer B2 are arranged, similarly to the shelf units U1 to U4 of the DEV layer B1, along a carry region R1 in which the carrier arm A2 moves, and are composed of the heating modules and the cooling modules tiered respectively. The heating modules include modules (PAB modules) each for heating (PAB) the wafer W after the resist is applied thereon, and water repellent modules each supplying HMDS gas to a front surface and a bevel portion of the wafer W while heating the wafer W to thereby perform water repellent treatment. The water repellent module includes a lid body forming a treatment space around the wafer W mounted on the heating plate as in the later-described heating module 3, and the HMDS gas is supplied to the treatment space. Unlike the treatment in the heating module 3, the HMDS gas is supplied to the entire front surface and the bevel portion of the wafer W in the water repellent module so that the entire front surface of the wafer W is subjected to the water repellent treatment in the water repellent module.

Further, in the treatment block C2, a shelf unit U5 is provided at a position to which the carrier arms A1 and A2 are accessible as shown in FIG. 1 and FIG. 3. The shelf unit U5 includes delivery stages TRS1 to TRS2, a delivery stage CPL2 having a temperature regulating function, and a delivery stage BF2 capable of temporarily storing a plurality of wafers, so as to deliver the wafer W to the carrier arms A1 and A2 provided in the blocks B1 and B2, respectively. A carrier arm D1 freely lifting up and down is provided near the shelf unit U5 and is accessible to the stages provided in the shelf unit U5. Further, the already-described delivery arm 22 in the carrier block C1 accesses each of the stages in the shelf unit U5 and delivers the wafer W between the carrier block C1 and the treatment block C2.

In a region adjacent to a cleaning block C3 in the carry region R1, a shelf unit U6 is further provided in the treatment block C2 at a position to which the carrier arm A1 and a later-described shuttle arm 26 are accessible as shown in FIG. 3. The shelf unit U6 includes a delivery stage TRS3 and a CPL1 similarly to the shelf unit U5.

The shuttle arm 26 that is a dedicated carrier device for directly carrying the wafer W from the delivery stage TRS2 provided in the shelf unit U5 to the delivery stage TRS3 provided in the shelf unit U6 is provided in an upper portion in the DEV layer B1.

From the treatment block C2 toward the aligner C5, the cleaning block C3 and an interface block C4 are provided in this order. In the cleaning block C3, a pre-exposure cleaning module 25, a post-exposure cleaning module 27, and delivery stages CPL3 and TRS4 are provided in tiers. Further, the cleaning block C3 includes a carrier arm A3 that is structured similarly to the carrier arms A1 and A2 and delivers the wafer W between the delivery stage TRS3 and CPL1 in the shelf unit U6, the cleaning modules 25 and 27, and the delivery stages TRS4 and CPL3.

In the interface block C4, an interface arm 28 is provided which can deliver the wafer W between each of the delivery stages in the cleaning module C3 and the aligner C5. The aligner C5 performs the already-described liquid-immersion exposure.

Figure 5:
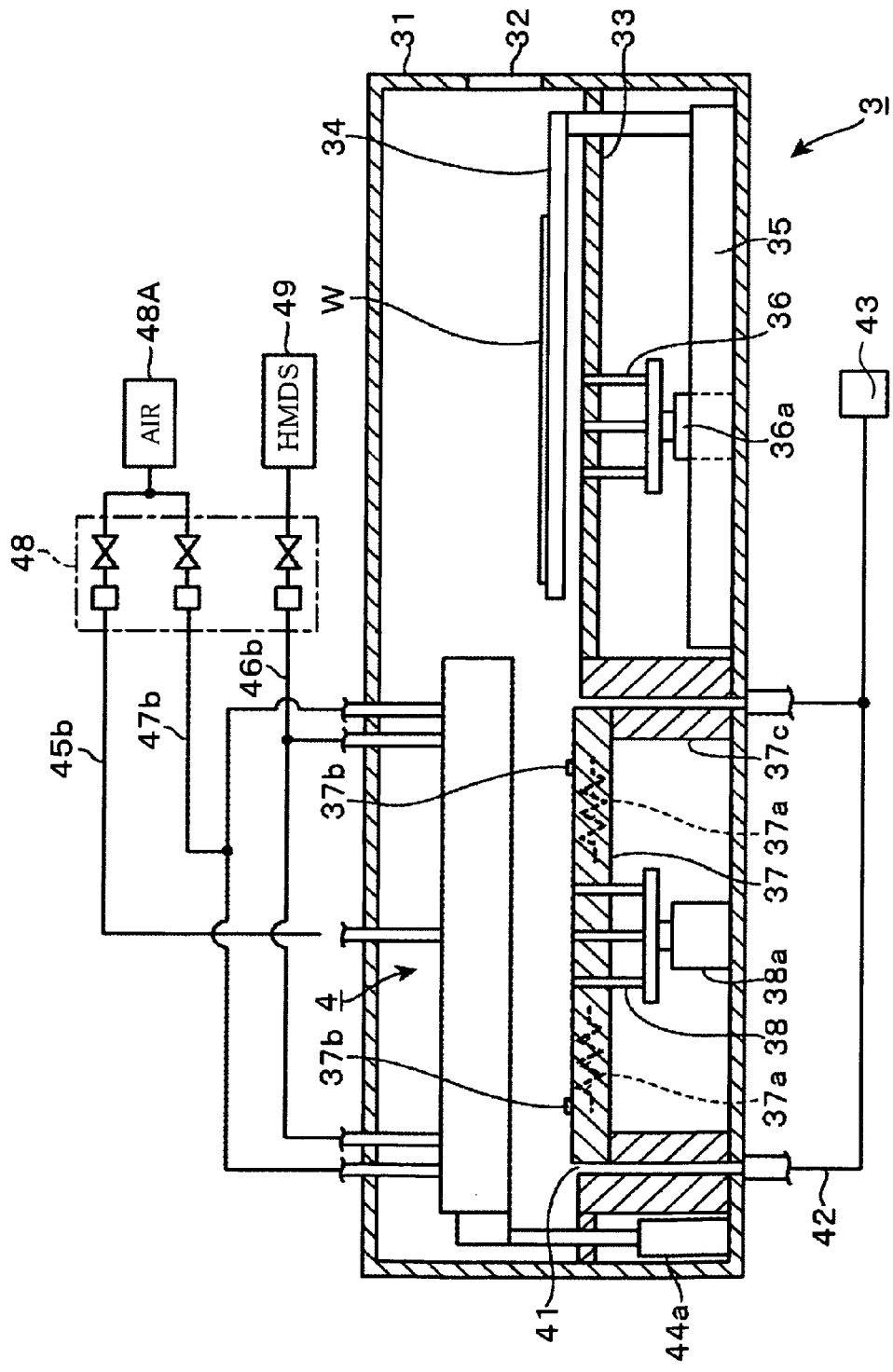
FIG. 5 is a side view of a heating apparatus performing a peripheral-edge portion water repellent treatment included in the treatment block.
Figure 6:
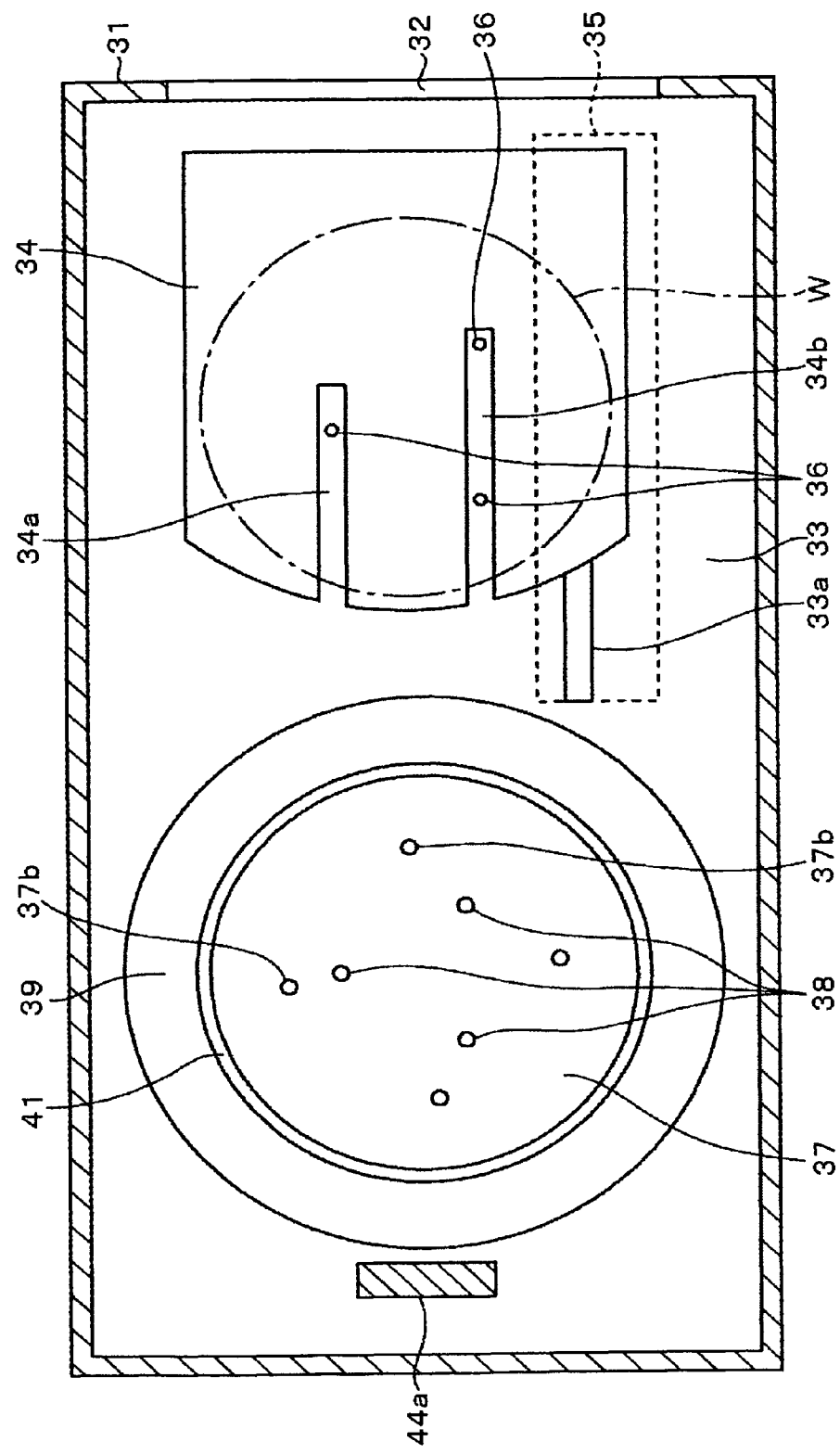
FIG. 6 is a transverse plan view of the heating apparatus.

Next, the heating module 3 will be described with reference to FIG. 5 and FIG. 6 that are a longitudinal side view and a transverse plan view respectively. The heating module 3 includes a casing 31 having a carrier opening 32 for the wafer W opened in a side wall. Numeral 33 in the drawings denotes a partition plate partitioning the inside of the casing 31 to upper and lower portions, and a horizontal cooling plate 34 is provided above the partition plate 33. The cooling plate 34 includes, on its rear surface side, a not-shown cooling flow path, for example, for a temperature regulating water to flow so that the heated wafer W is roughly cooled when mounted on the cooling plate 34.

The cooling plate 34 is connected to a drive mechanism 35 provided under the partition plate 33, and horizontally moves by means of the drive mechanism 35 to a position above the heating plate 37 that is provided on the back side assuming that the carrier opening 32 side is the front side in the casing 31. Numeral 33a in the drawings denotes a slit, which is provided in the partition plate 33, for the cooling plate 34 to move. Numerals 34a and 34b denote slits, which are provided in the cooling plate 34, for later-described lift pins to project and retract to/from above the cooling plate 34.

Numerals 36 in the drawings denote three lift pins lifting up and down by means of a lift mechanism 36*a*, which deliver the wafer W between the cooling plate 34 moved to the carrier opening 32 side in the casing 31 and the carrier arm A1.

To describe the heating plate 37, heaters 37*a* are provided therein. The heater 37*a* controls the temperature of a front surface of the heating plate 37 based on a control signal outputted from a later-described control unit 100 to heat the wafer W mounted thereon at an arbitrary temperature. On the front surface of the heating plate 37, a plurality of pins 37*b* for mounting the wafer W thereon in a manner that the wafer W is kept slightly lifted above from the front surface of the heating plate 37, are provided in the circumferential direction of the heating plate 37. Numerals 38 in the drawings denote three lift pins lifting up and down by means of a lift mechanism 38*a*, which deliver the wafer W between the cooling plate 34 moved to a position above the heating plate 37 and the heating plate 37. Numeral 37*c* in the drawings denotes a support part of the heating plate 37.

A cylindrical division wall 39 is formed to surround the heating plate 37 and the support part 37*c*, and a space between the division wall 39 and the heating plate 37 and the support part 37*c* is formed as an exhaust path 41 in a ring shape. To the exhaust path 41, one end of an exhaust pipe 42 for exhausting a later-described treatment space 40 via the exhaust path 41 is connected. The other end of the exhaust pipe 42 is connected to an exhauster 43 composed of a vacuum pump or the like. The exhauster 43 includes a not-shown pressure regulating unit and exhausts the later-described treatment space 40 at an arbitrary exhaust rate according to a control signal outputted from the control unit 100.

A lid body 4 that is capable of lifting up and down by means of a lift mechanism 44*a* is provided above the heating plate 37. The structure of the lid body 4 constituting a gas supply unit will be described with reference also to FIG. 7. A peripheral edge portion of the lid body 4 forms a projecting edge part 4*a* projecting downward, so that when the lid body 4 is lifted down, the projecting edge part 4*a* is brought into close contact with the division wall 39 via a not-shown seal member to thereby form, around the wafer W mounted on the heating plate 37, the treatment space 40 that is hermetically closed. At a central portion of a ceiling plate 4*b* of the lid body 4, a gas distribution space 45 is provided in a flat circular shape divided to be opposite a central portion of the wafer W mounted on the heating plate 37. Further, gas distribution spaces 46 and 47 are concentrically provided outside the gas distribution space 45 of the ceiling plate 4*b*. The gas distribution space 46 is provided, for example, above the peripheral edge portion of the wafer W, and the gas distribution space 47 is provided, for example, above the exhaust path 41.

Figure 7:
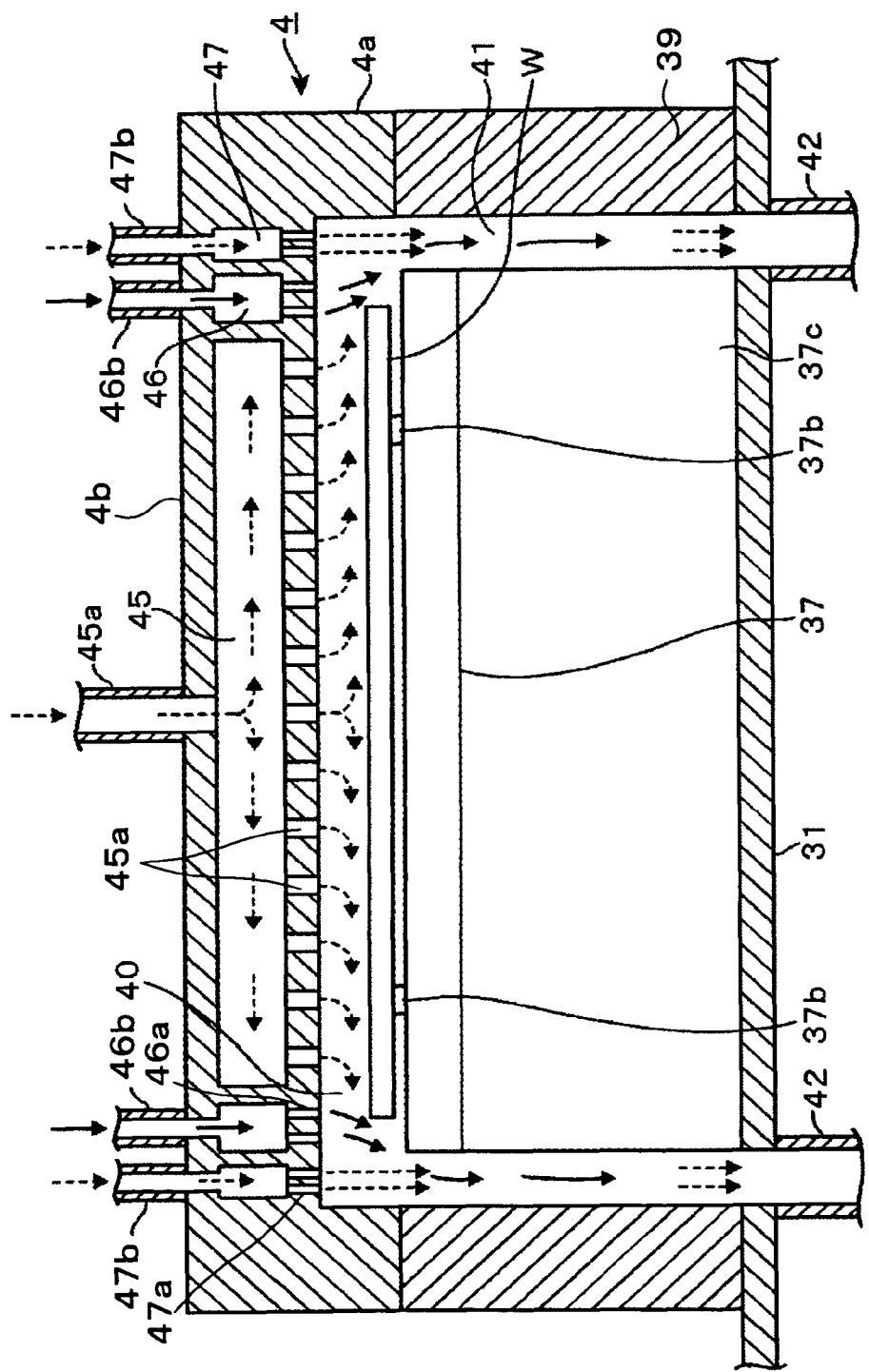
FIG. 7 is a longitudinal side view of a lid body of the heating apparatus.

Under the gas distribution spaces 45, 46, and 47 in the lid body 4, many small holes 45*a*, 46*a*, and 47*a* communicating with those spaces respectively are pierced in a dispersed manner. Air, gas for water repellent treatment containing, for example, vaporized HMDS (described as HMDS gas), and air are discharged respectively from the distribution spaces 45, 46, and 47 toward the wafer W below them. The gasses discharged to the wafer W are sucked by exhausting from the exhaust path 41 to the outside of the wafer W, flow into the exhaust path 41, and are then exhausted therefrom. In FIG. 7, broken lines with arrows indicate the flow of air, and solid lines with arrows indicate the flow of the HMDS gas. The air from the distribution space 45 is a purge gas sweeping a sublimate generated from the wafer W due to heating, from the central portion of the wafer W to its outer periphery to remove it, and sweeping an excessive HMDS gas from the peripheral edge portion of the wafer W to the outer periphery to prevent the excessive HMDS gas from adhering to the resist film. Further, the air from the distribution space 47 is also a purge gas sweeping the HMDS gas toward the exhaust path 41 to restrict the flow of the HMDS gas and prevent the HMDS gas from adhering to the resist film. As described above, by providing the lid body 4 formed with the gas distribution spaces 45, 46, and 47 in the heating module 3, the heating module 3 also serves as a substrate side-surface portion water repellent module that performs water repellent treatment on the side surface portion of the wafer W.

One ends of gas supply pipes 45*b* and 47*b* are connected to the gas distribution spaces 45 and 47, and the other ends of the gas supply pipes 45*b* and 47*b* are connected to a gas supply source 48A in which air is stored, via a gas flow rate control equipment group 48 composed of valves and mass flow controllers. One end of a gas supply pipe 46*b* is connected to the distribution space 46, and the other end of the gas supply pipe 46*b* is connected to a supply source 49 of the HMDS gas via the gas flow rate control equipment group 48. The gas flow rate control equipment group 48 controls supply and stop of the gasses to the wafer W according to a control signal outputted from the later-described control unit 100.

Next, the control unit 100 will be described. The control unit 100 is composed of, for example, a computer and has a not-shown program storage unit. In the program storage unit, a program composed of, for example, software in which a command (a step group) is created to perform the coating and developing treatment which will be described in the later-described effect. By reading the program out to the control unit 100, the control unit 100 controls the operations of the carrier devices such as the carrier arms A, the temperatures for heating the wafer W in the heating modules, the supply of chemicals for the wafer W in the coating module and so on. This program is stored in a program storage unit while being stored in a storage medium such as, for example, a hard disk, a compact disk, a magneto-optical disk, or a memory card.

Figure 8:
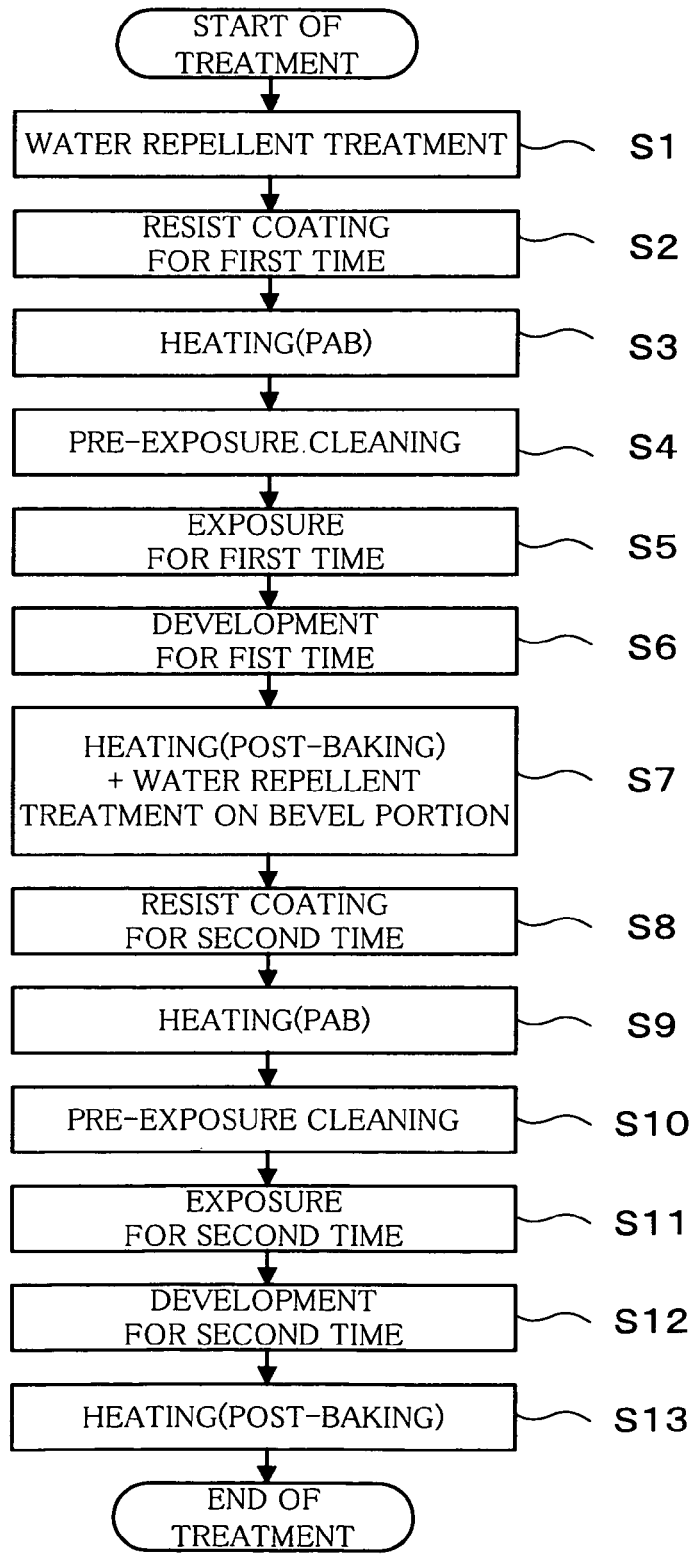
FIG. 8 is a flowchart showing a treatment process of the coating and developing apparatus.

Next, the treatment process of performing the double patterning which has been described in the Related Art will be described using the coating and developing apparatus 2 with reference to FIG. 8 that is a flowchart showing the process and FIGS. 9A to 9G that show changes of the peripheral edge portion of the wafer W. In this treatment process, a resist pattern having a ratio between the width of a projecting portion and the width of a recessed portion being 1:1 is formed. At the beginning, the carrier 20 housing the wafers W is carried from the outside and mounted on the mounting table 21 in the carrier block C1, and the wafer W is carried by the delivery arm 22 from the carrier 20 to the delivery stage CPL2 in the shelf unit U5.

Figure 9A:
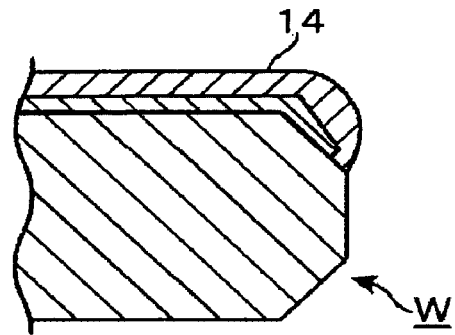
FIGS. 9A to 9G are explanatory views showing the peripheral edge portion of a wafer in the treatment process, FIG. 9A showing a state in which a resist is applied to the entire front surface of the wafer, FIG. 9B showing an appearance in which the wafer is subjected to liquid-immersion exposure, FIG. 9C showing a state in which a resist pattern is formed after development, FIG. 9D showing a state in which a bevel portion of the wafer is exposed to HMDS gas, FIG. 9E showing a state in which a new resist film is formed on the wafer, FIG. 9F showing an appearance in which the wafer is subjected to liquid-immersion exposure, and FIG. 9G showing a state in which a resist pattern is formed.

The delivery arm A2 provided in the COT layer B2 carries the wafer W from the delivery stage CPL2 to a hydrophobic treatment module ADH included in the shelf units U1 to U4 of the COT layer B2, and the HMDS gas is supplied to the front surface and the bevel portion of the wafer W while the wafer W is being heated, whereby the wafer W is subjected to water repellent treatment (Step S1). Thereafter, the carrier arm A2 carries the wafer W to the cooling module included in the shelf units U1 to U4, where the wafer W is cooled. Thereafter, the carrier arm A2 carries the wafer W to the coating module, where a resist is applied to the entire front surface of the wafer W to form a resist film 14 as shown in FIG. 9A (Step S2).

After formation of the resist film 14, the carrier arm A2 carries the wafer W to the heating module in the shelf units U1 to U4, where the wafer W is subjected to heat treatment (PAB treatment) (Step S3). Then, the carrier arm A2 carries the wafer W to the cooling module included in the shelf units U1 to U4, and the wafer W is cooled in the cooling module. The carrier arm A2 carries the wafer W to the delivery stage BF2 in the shelf unit U5.

Figure 9B:
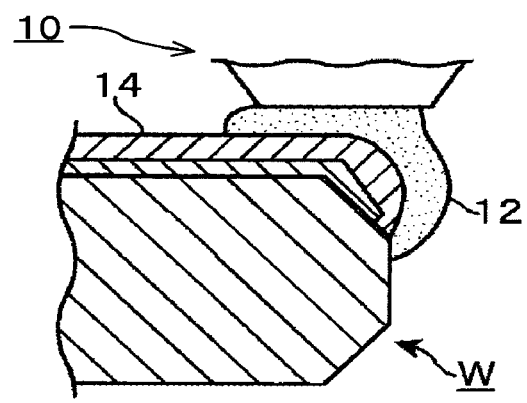

Thereafter, the wafer W is carried in the order of the delivery arm D1, the delivery stage TRS2, the shuttle arm 26, the delivery stage TRS3 in the shelf unit U6, the carrier arm A3 in the cleaning block C3, and the pre-exposure cleaning module 25. Then, the wafer W is cleaned in the pre-exposure cleaning module 25 with a cleaning solution supplied to its front surface (Step S4), and the wafer W is then carried in the order of the carrier arm A3, the delivery stage CPL3, the interface arm 28 in the interface block C4, and the aligner C5, and subjected to liquid-immersion exposure in the aligner C5 as shown in FIG. 9B (Step S5).

Subsequently, the wafer W is carried from the aligner C5 in the order of the interface arm 28, the delivery stage TRS4, the delivery arm A3, and the post-exposure cleaning module 27. Then, after the wafer W is cleaned similarly when it was carried to the pre-exposure cleaning module 25, the wafer W is carried in the order of the carrier arm A3, the delivery stage CPL1, the carrier arm A1 in the DEV layer B1, and the heating module in the shelf unit U4 of the DEV layer B1, and subjected to heat treatment (PEB treatment) in the heating module.

Figure 9C:
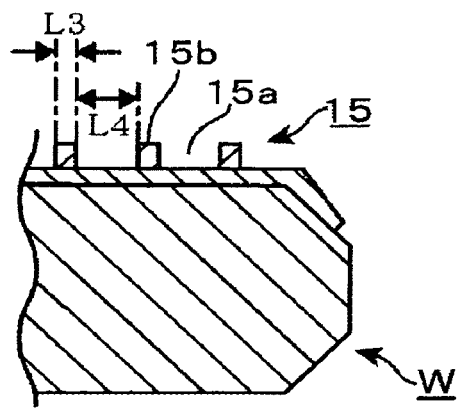

Thereafter, the wafer W is carried by the carrier arm A1 to the cooling module in the shelf units U1 to U4, where the wafer W is cooled. Thereafter, the wafer W is carried to the developing module 23, where the wafer W is developed with a developing solution supplied to its front surface (Step S6). Thereafter, a cleaning solution is supplied to the front surface to wash the developing solution away, whereby a resist pattern 15 is formed as shown in FIG. 9C. As described in the section of the Related Art, the ratio between a line width L4 of a recessed portion 15a and a line width L3 of a projecting portion 15b of the resist pattern 15 is 3:1.

Figure 9D:
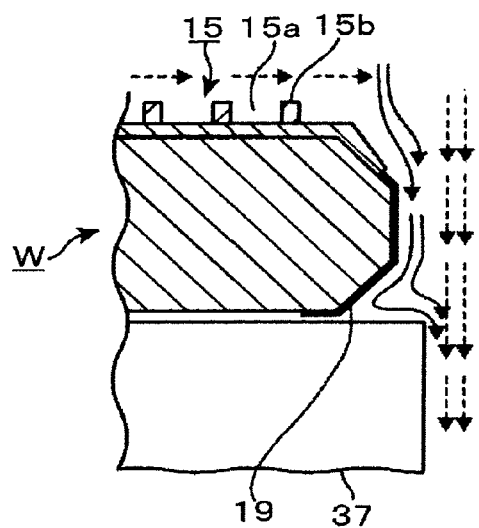

The wafer W on which the resist pattern 15 has been formed is carried by the carrier arm A1 to the heating module 3, and when the wafer W is mounted on the heating plate 37 via the cooling plate 34, the lid body 4 lowers to form the treatment space 40. Then, the wafer W is heated by the heating plate 37, whereby the wafer W is subjected to heat treatment after development (post-baking treatment). Further, the air, the HMDS gas, and the air are supplied from the gas distribution spaces 45, 46, and 47 of the lid body 4 respectively to the wafer W as shown in FIG. 7 so that the bevel portion of the wafer W is exposed to the HMDS gas as shown in FIG. 9D and a water-repellent thin film 19 is formed from the HMDS gas, whereby the wafer W is locally subjected to water repellent treatment (Step S7).

After a lapse of a predetermined time from the supply of the gasses, the supply of the gasses is stopped, and the wafer W is carried by the carrier arm A1 to the cooling module in the shelf units U1 to U4 and cooled therein. Thereafter, the wafer W is carried in the order of the carrier arm A1, the delivery stage TRS1 in the shelf unit U5, and the delivery arm 22, and then once returned by the delivery arm 22 to the carrier 20.

Figure 9E:
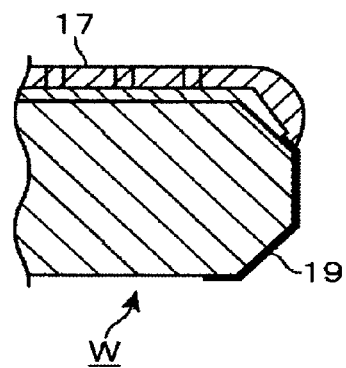

The wafer W returned to the carrier 20 is carried in the order of the delivery arm 22, the delivery stage CPL2, the carrier arm A2, and the cooling module in the shelf units U1 to U4, temperature-regulated in the cooling module, and then carried by the carrier arm A2 to the coating module. A resist is applied to the front surface of the wafer W, whereby the resist pattern 15 is buried in the resist as shown in FIG. 9E, so that a new resist film 17 is formed on the wafer W (Step S8).

After the formation of the resist film 17, the carrier arm A2 carries the wafer W to the heating module in the shelf units U1 to U4. After subjected to heat treatment (PAB) (Step S9), the wafer W is carried in the order of the carrier arm A2, the cooling module in the shelf units U1 to U4, the delivery stage BF2 in the shelf unit U5, the delivery arm D1, the delivery stage TRS2, the shuttle arm 26, the delivery stage TRS3 in the shelf unit U6, the carrier arm A3 provided in the cleaning block C3, and the pre-exposure cleaning module 25, and is cleaned in the pre-exposure cleaning module 25 (Step S10).

Figure 9F:
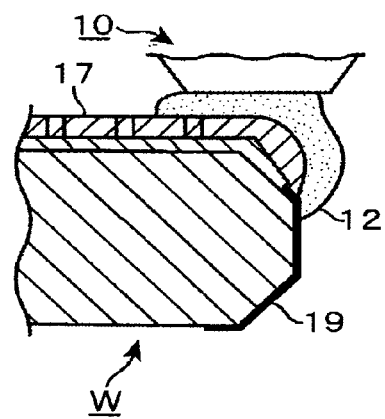

After the cleaning, the wafer W is carried in the order of the carrier arm A3, the delivery stage CPL3, the interface arm 28, and the aligner C5, and the wafer W is subjected to liquid-immersion exposure in the aligner C5 as shown in FIG. 9F (Step S11). In this event, with pure water constituting a solution film 12 being prevented from adhering to the bevel portion and running to the rear surface of the wafer W over the bevel portion because the water-repellent thin film 19 has been formed on the bevel portion of the wafer W, an exposure device 10 moves above the wafer W and performs exposure along the predetermined pattern.

Figure 9G:
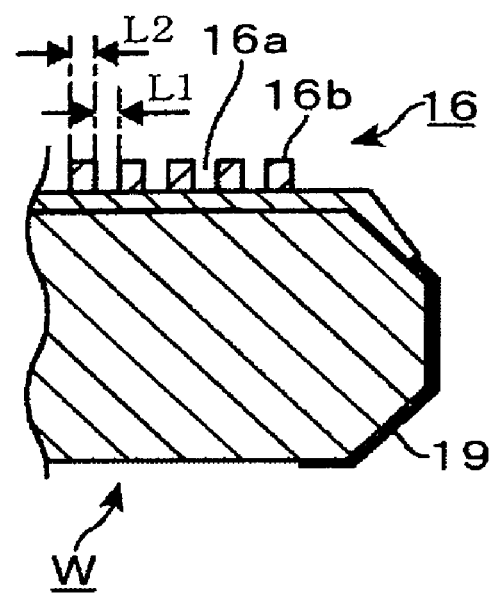

After the exposure, the wafer W is carried from the aligner C5 in the order of the interface arm 28, the delivery stage TRS4, the carrier arm A3, and the post-exposure cleaning module 27, and cleaned in the post-exposure cleaning module 27. Then, the wafer W is carried in the order of the carrier arm A3, the delivery stage CPL1, the carrier arm A1, and the heating module, and subjected to heat treatment (PEB treatment). The wafer W is then carried in the order of the carrier arm A1, the cooling module in the shelf units U1 to U4, and the developing module 23, and subjected to developing treatment similarly to the developing treatment for the first time (Step S12), whereby a resist pattern 16 having a ratio between a line width L1 of a recessed portion 16a and a line width L2 of a projecting portion 16b being 1:1 is formed as shown in FIG. 9G The wafer W is then carried to the heating module 3 and subjected here to heat treatment (post baking) (Step S13). In the heat treatment for the second time in the heating module 3, the wafer is heated, for example, while the HMDS gas is not supplied to the wafer W but only the air is being supplied unlike the treatment for the first time. Thereafter, the wafer W is carried in the order of the carrier arm A1, the cooling module in the shelf units U1 to U4, the carrier arm A1, the delivery stage TRS1 in the shelf unit U5, the delivery arm 22, and returned by the delivery arm 22 to the carrier 20.

According to this coating and developing apparatus 2, after the development for the first time in the developing module 23, the HMDS gas is supplied to the bevel portion of the wafer W in the heating module 3 to perform water repellent treatment on the bevel portion, so that a high water repellency can be achieved at the bevel portion during the liquid-immersion exposure for the second time in the aligner C5, thereby making it possible to prevent the liquid used in the liquid-immersion exposure from adhering to the bevel portion and running to the rear surface of the wafer W via the bevel portion. As a result, it is possible to prevent occurrence of particles from the adhered liquid and the liquid run to the rear surface. Further, since the flow of the HMDS gas is restricted by the supply and exhaust of the air in the heating module 3, supply of the HMDS gas to the front surface on the central portion side of the bevel portion is suppressed so that deterioration of the shape of the pattern can be prevented. Further, since the HMDS gas is supplied to the wafer W during the heat treatment after development so that the heat treatment and the water repellent treatment on the bevel portion are simultaneously performed in the heating module 3, a reduction in throughput can be prevented as compared to the case where the heat treatment and the water repellent treatment are separately performed.

To improve the resolution of the resist pattern 16 in the above-described example, after the wafer W is returned to the carrier 20 after completion of the development for the first time, the carrier 20 may be carried to an external apparatus where, for example, an ultraviolet ray is applied to the wafer W to cure the resist pattern 15, and then the carrier 20 may be returned again to the coating and developing apparatus 2 so that the wafer W is subjected to the resist coating for the second time and treatments subsequent thereto. Further, such a device applying the ultraviolet ray may be provided in the coating and developing apparatus 2 to perform application treatment before the resist coating for the second time.

Second Embodiment

Figure 10:
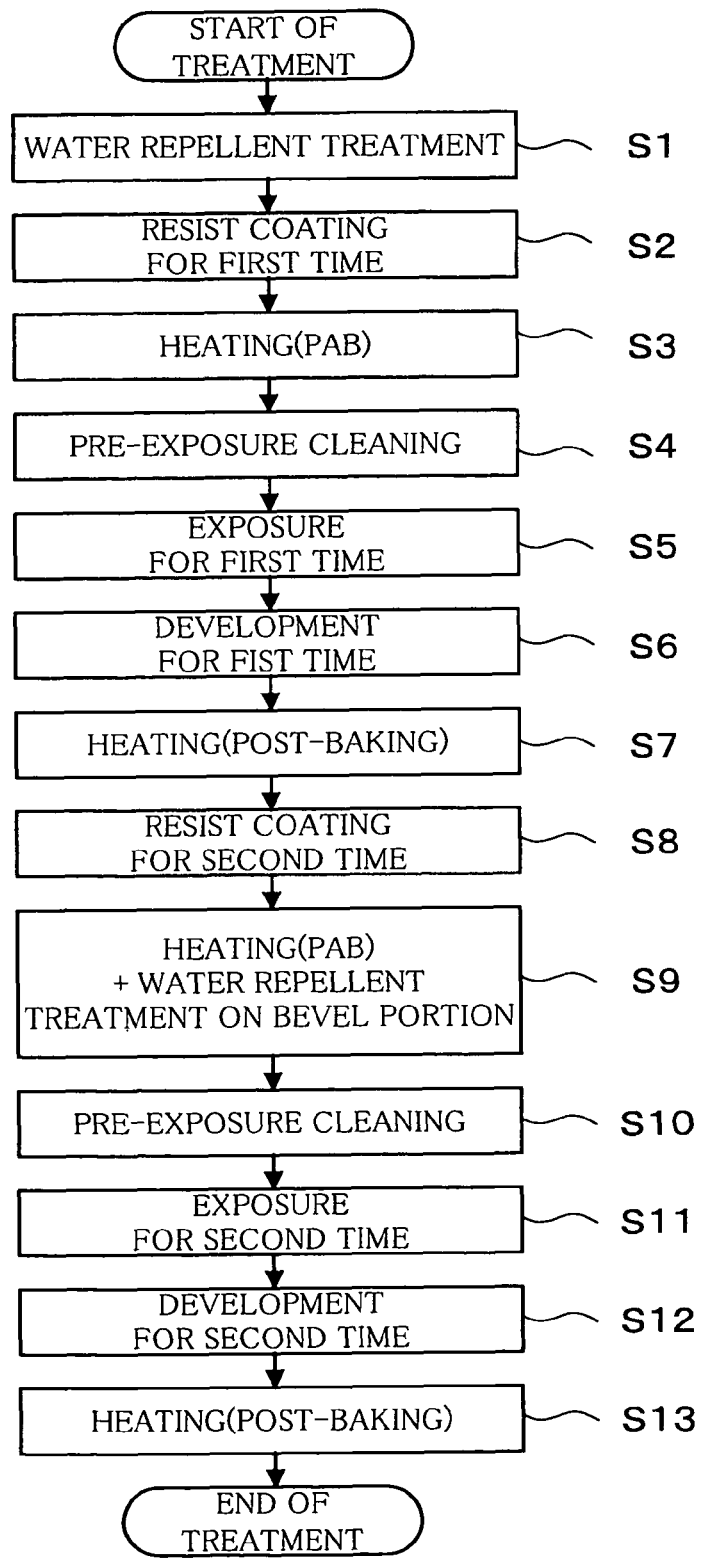
FIG. 10 is a flowchart showing another treatment process of the coating and developing apparatus.

However, the above-described water repellent treatment on the bevel portion only needs to be performed after the developing treatment for the first time and before the liquid-immersion exposure for the second time, and a post-coating heating module performing the PAB treatment in the shelf units U1 to U4 of the COT layer B2 may be structured as the heating module 3 to perform the water repellent treatment. The flowchart in FIG. 10 shows one example of the treatment process in the coating and developing apparatus 2 when the heating module 3 is placed in the COT layer B2 as described above. To describe mainly the different points from the already-described first embodiment, the heating plate 37 in the heating module 3 is used to heat the wafer W to thereby perform the PAB treatment at Step S3. In this event, only the air is supplied to the wafer W, but the HMDS gas is not supplied. In addition, the HMDS gas is not supplied also when the post-baking treatment on the wafer W is performed in the DEV layer B1 at Step S7. Then, when the wafer W is carried, after the resist coating for the second time, into the heating module 3 to be subjected again to the PAB treatment, the air and the HMDS gas are supplied to the treatment space 40 while the wafer W is being heated similarly to the post-baking treatment in the first embodiment, thereby performing the water repellent treatment on the bevel portion. The second embodiment can achieve the same effects as those of the first embodiment.

Third Embodiment

Figure 11:
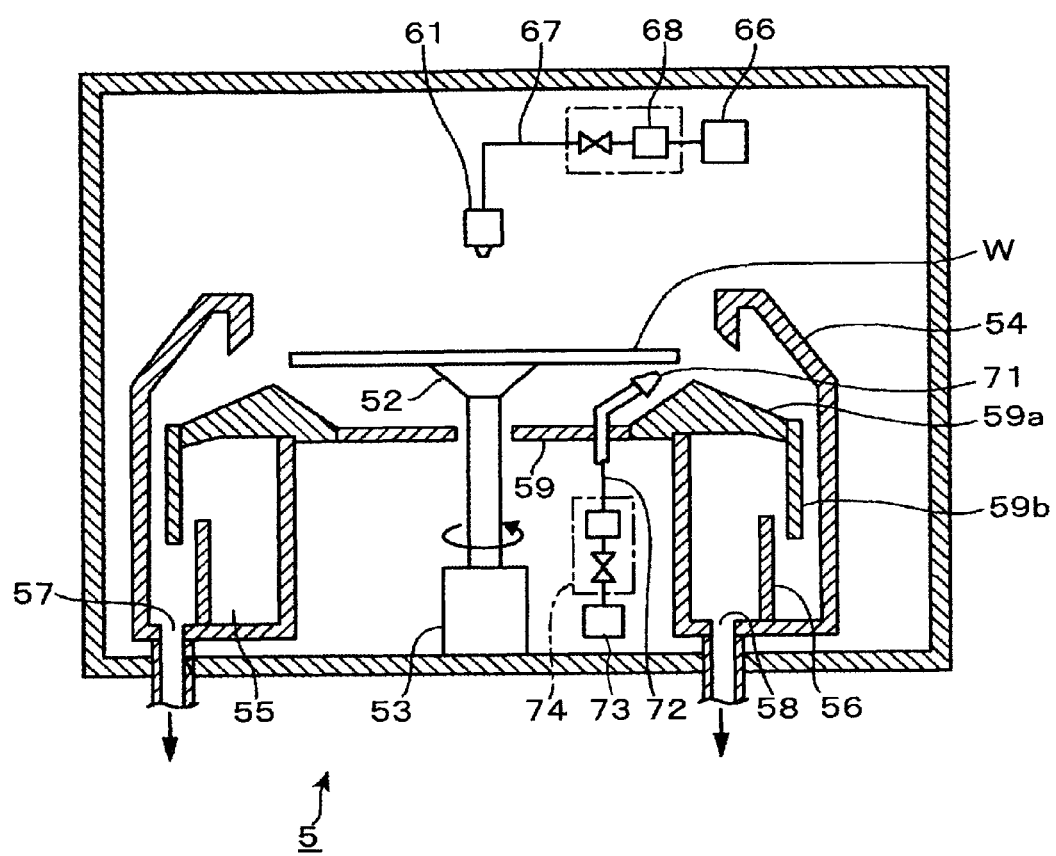
FIG. 11 is a longitudinal side view of a pre-exposure cleaning module provided in the coating and developing apparatus.
Figure 12:
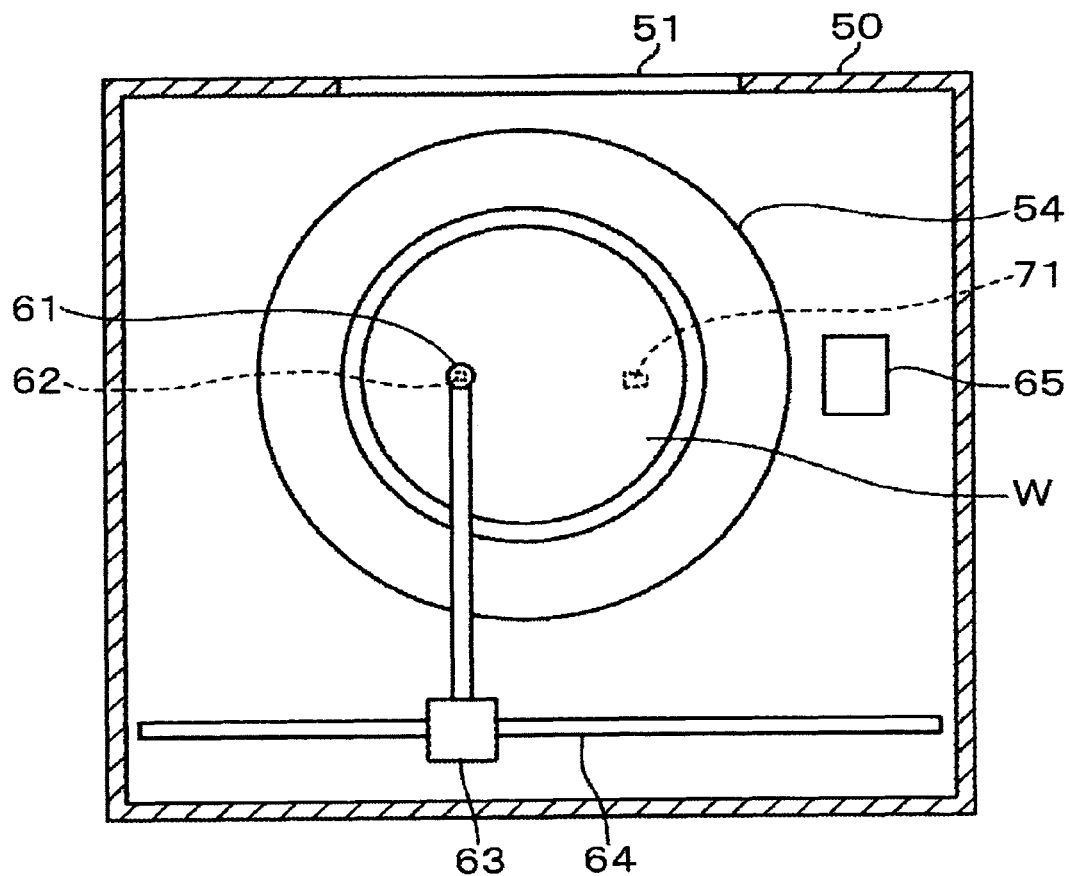
FIG. 12 is a transverse plan view of the pre-exposure cleaning module.

A device performing the water repellent treatment on the bevel portion of the wafer W may be provided in the pre-exposure cleaning module 25 in the cleaning block C3 so that the cleaning and water repellent treatment are performed in the pre-exposure cleaning module 25. FIG. 11 and FIG. 12 respectively show a longitudinal side view and a plan view of a pre-exposure cleaning module 5 including the device performing the water repellent treatment as described above. The pre-exposure cleaning module 5 includes a casing 50 formed with a carrier opening 51 for the wafer W. Numeral 52 in the drawings denotes a spin chuck forming a mounting table that absorbs by suction the central portion on the rear surface side of the wafer W and horizontally holds the wafer W. The spin chuck 52 is connected to a drive mechanism 53 and can rotate and lift up and down by means of the drive mechanism 53 while holding the wafer W thereon. A cup body 54 that is open on the upper portion side is provided to surround the wafer W held on the spin chuck 52.

On the bottom portion side of the cup body 54, a solution receiving part 55 forming the shape of a recessed portion is formed over the whole circumference below the peripheral edge of the wafer W. The inside of the solution receiving part 55 is divided by a vertical partition wall 56 into an outer region and an inner region over the whole circumference. A drain port 57 for draining the drain stored in the solution receiving part 55 is provided in the outer region, and an exhaust port 58 for exhausting the cup body 54 is provided in the inner region.

Numeral 59 in the drawings denotes a circular plate, a numeral 59a denotes a ring member surrounding the circular plate 59, and a numeral 59b denotes an end plate extending downward from the outer end of the ring member 59a. The pure water that is the cleaning solution scattered from the wafer W is guided to the outer region, along the end plate 59b and the front surface of the ring member 59a. Note that, though not shown, lift pins that can lift up and down while supporting the rear surface side of the wafer W are provided in a manner to vertically penetrate the circular plate 59 so that the wafer W is delivered between the delivery arm A3 and the spin chuck 52 via the lift pins.

Above the wafer W held on the spin chuck 52, a pure water supply nozzle 61 having a discharge port 62 in a pore shape is provided and is connected to a moving base 63 that includes a lift mechanism lifting up and down the pure water supply nozzle 61. Numeral 64 in the drawings denotes a guide rail extending in the horizontal direction, and the pure water supply nozzle 61 moves along the guide rail 64 following the movement of the moving base 63. Numeral 65 in the drawings denotes a waiting region of the pure water supply nozzle 61. Further, a numeral 66 denotes a pure water supply source connected to the pure water supply nozzle 61 via a supply path 67 for the pure water.

In the circular plate 59, a water repellent solution supply nozzle 71 that is a chemical supply unit is provided in a manner to be inclined toward the outside of the wafer W. The water repellent solution supply nozzle 71 includes a discharge port in a pore shape opening toward the peripheral edge portion of the wafer W, and is connected to a water repellent solution supply source 73 via a supply path 72. As the water repellent solution, a solution containing, for example, HMDS is used. Along the supply paths 67 and 72, supply control units 68 and 74 are provided each including a valve and a mass flow controller. The supply control units 68 and 74 control supply and stop of the pure water and the water repellent solution to the wafer W respectively under a control signal outputted from the control unit 100.

The treatment process in the pre-exposure cleaning module 5 will be described. First, when the wafer W is delivered by the carrier arm A3 to the spin chuck 52, the pure water supply nozzle 61 moves from the waiting region 65 to a position above the center portion of the wafer W, and the wafer W is rotated by the spin chuck 52 at a predetermined number of rotations. The pure water is supplied from the pure water supply nozzle 61 to the center portion of the wafer W and spread to the peripheral edge portion of the wafer W by the centrifugal force, whereby the wafer W is cleaned.

Figure 13A:
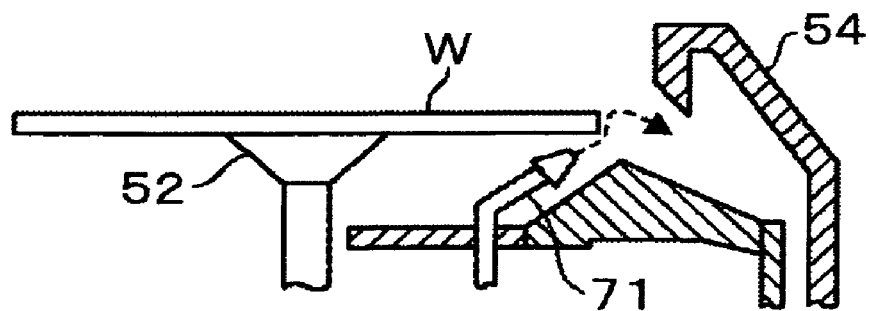
FIGS. 13A and 13B are explanatory view showing appearances in which the bevel portion of the wafer is subjected to water repellent treatment in the cleaning apparatus, and FIG. 13A showing a state in which a water repellent solution is supplied to an inclined surface of the bevel portion of the wafer, and FIG. 13B showing an appearance in which the water repellent solution is scattered from a side end surface of the wafer.
Figure 13B:
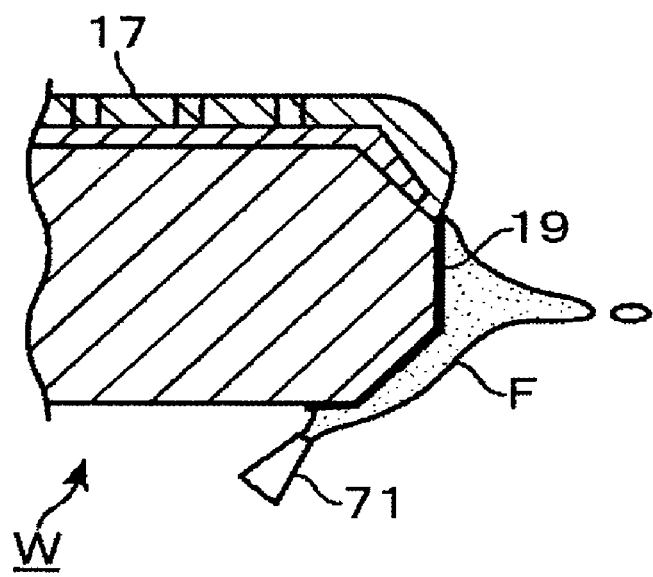

After stop of the discharge of the pure water, the pure water is drained off from the wafer W due to the rotation of the wafer W, whereby the wafer W is dried. Thereafter, a water repellent solution F is supplied to an inclined surface on the lower side forming the bevel portion of the wafer W as shown by a broken line with an arrow in FIG. 13A, and the water repellent solution F runs upward on a side end surface of the rotated wafer W by the surface tension as shown in FIG. 13B, and is then scattered from the wafer W and drained. After the supply of the water repellent solution F is continued for a predetermined time, the supply of the water repellent solution F is stopped, and a solvent contained in the water repellent solution F evaporates due to the rotation of the wafer W, so that a water repellent thin film 19 is formed on the bevel portion.

Thereafter, the rotation of the wafer W is stopped, and the wafer W is carried out of the cleaning module 5. Note that the supply of the pure water to the front surface of the wafer W and the supply of the water repellent solution F to the bevel portion may be simultaneously performed.

Figure 14:
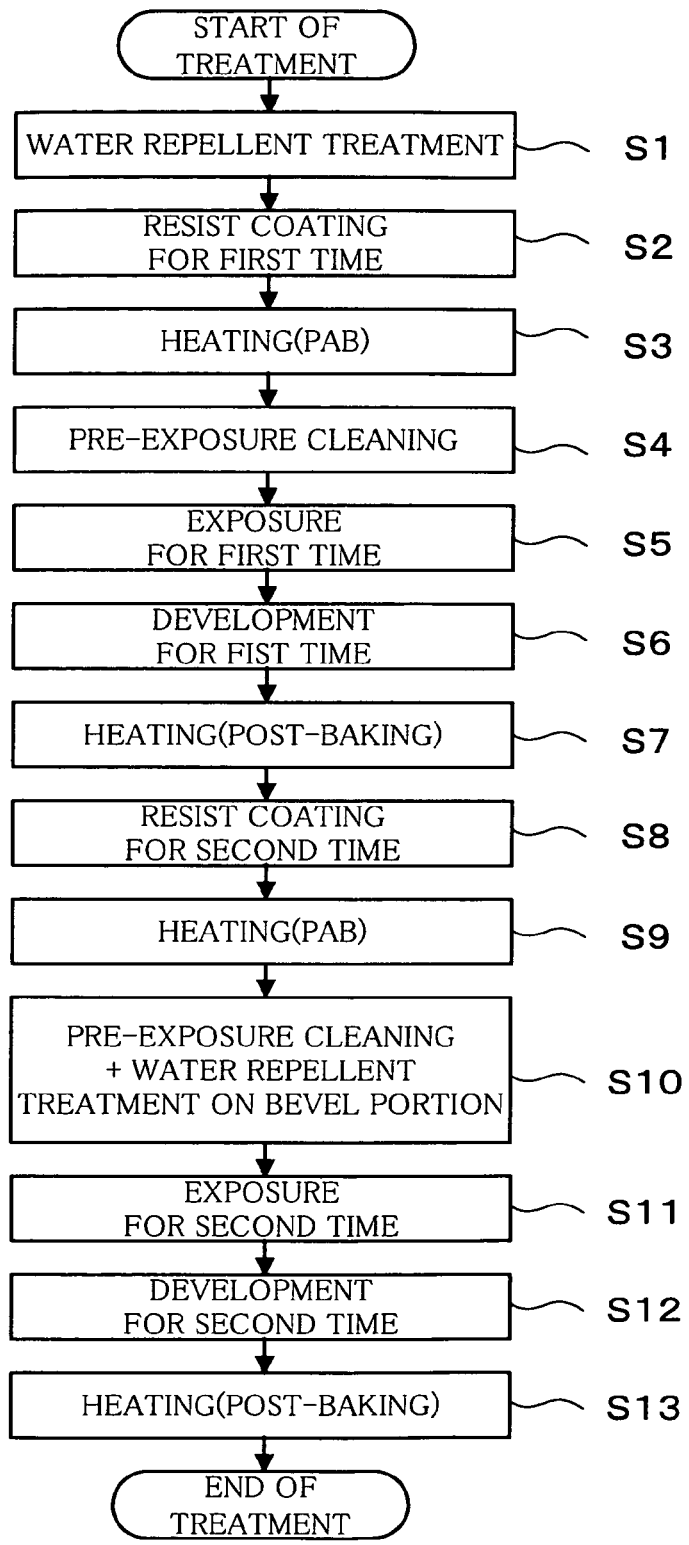
FIG. 14 is a flowchart showing a treatment process of the coating and developing apparatus including the cleaning module.

FIG. 14 is a flowchart showing the treatment process of the coating and developing apparatus 2 in which the pre-exposure cleaning module 5 is provided. As shown in this flowchart, the supply of the HMDS gas to the bevel portion of the wafer W is not performed at the heat treatment in the heating module in this example, but the pre-exposure cleaning and the water repellent treatment on the bevel portion of the wafer W are performed as described above at Step S10 after the PAB treatment for the second time and before the exposure for the second time. At the pre-exposure cleaning for the first time at Step S4, for example, the above-described supply of the water repellent solution is not performed but the pure water is supplied to the front surface of the wafer W, and the wafer W is carried out of the module after drying of the wafer W is completed. In this embodiment, the water repellent treatment is also performed on the bevel portion of the wafer W before the liquid-immersion exposure for the second time, thus making it possible to prevent the liquid from adhering to the bevel portion and running to the rear surface at the liquid-immersion exposure for the second time.

The pre-exposure cleaning module 5 may be provided in the interface block C4, instead of being provided in the cleaning block C3, so that the wafer W is delivered between the interface arm 28 and the spin chuck 52.

Further, though the example in which a substrate side-surface portion water repellent module that performs water repellent treatment on the substrate side surface portion is incorporated in the heating module 3 that performs heating after development and the example in which the substrate side-surface portion water repellent module is incorporated in the pre-exposure cleaning module have been shown in the above embodiments, the substrate side-surface portion water repellent module may be independently provided. Further, the developing treatment unit 24 in the developing module 23 and the coating treatment unit in the coating module include respective spin chucks and cup bodies that are similar to those of the pre-exposure cleaning module, and further include a developing solution supply nozzle and a resist supply nozzle respectively which correspond to the pure water supply nozzle. The developing solution supply nozzle and the resist supply nozzle are structured almost similarly to the pure water supply nozzle except that the chemicals to be discharged and the shapes of the nozzles are different from those of the pure water supply nozzle. The water repellent solution supply nozzle 71 may be provided in the developing treatment unit 24 in the developing module 23 and the coating treatment unit in the coating module to perform water repellent treatment. When the water repellent treatment on the wafer W is performed in the developing treatment unit 24, the cleaning solution, for example, pure water is supplied, for example, to the wafer W to wash away the developing solution and then the already-described water repellent solution F is supplied to perform treatment at the development for the first time at Step S6. When the water repellent treatment on the wafer W is performed in the coating module, the water repellent solution F is supplied to the wafer W to perform treatment before start of the resist coating for the second time or after the resist coating for the second time.

Fourth Embodiment

To improve the water repellency of the bevel portion of the wafer W and improve the adhesion of the resist to the wafer W, the HMDS gas is supplied to the wafer W in the water-repellent module before the resist coating for the first time in the above-described embodiments. A treatment process, in which the treatment in the water repellent module is not performed but only the bevel portion of the wafer W is exposed to light after the resist coating for the first time on the wafer W and before start of the liquid-immersion exposure for the first time, will be described. Here, the water repellent solution supply nozzle 71 shall be provided, for example, in the coating module as described above. After the resist coating for the first time is performed on the wafer W in the coating module, the water repellent solution is supplied from the water repellent solution supply nozzle 71, whereby the bevel portion of the wafer W is subjected to water repellent treatment. Thereafter, the wafer W is through the developing treatment for the first time, and carried again to the coating module. Then, before or after resist coating, the water repellent treatment is performed again on the bevel portion.

When the heating module 3 is provided, for example, in the COT layer B2 as the PAB module as in the second embodiment, the treatment by the water repellent module is not performed, but after the resist coating for the first time is performed, the wafer W may be carried to the heating module 3 and subjected to the PAB treatment and the water repellent treatment on the bevel portion of the wafer W. Thereafter, the treatments after Step S3 in the second embodiment may be sequentially carried out to form a resist pattern. In short, the module performing the water repellent treatment on the substrate side surface portion for the first time and the module performing the water repellent treatment on the substrate side surface portion for the second time are made common in these examples.

(Reference Test)

Figure 15:
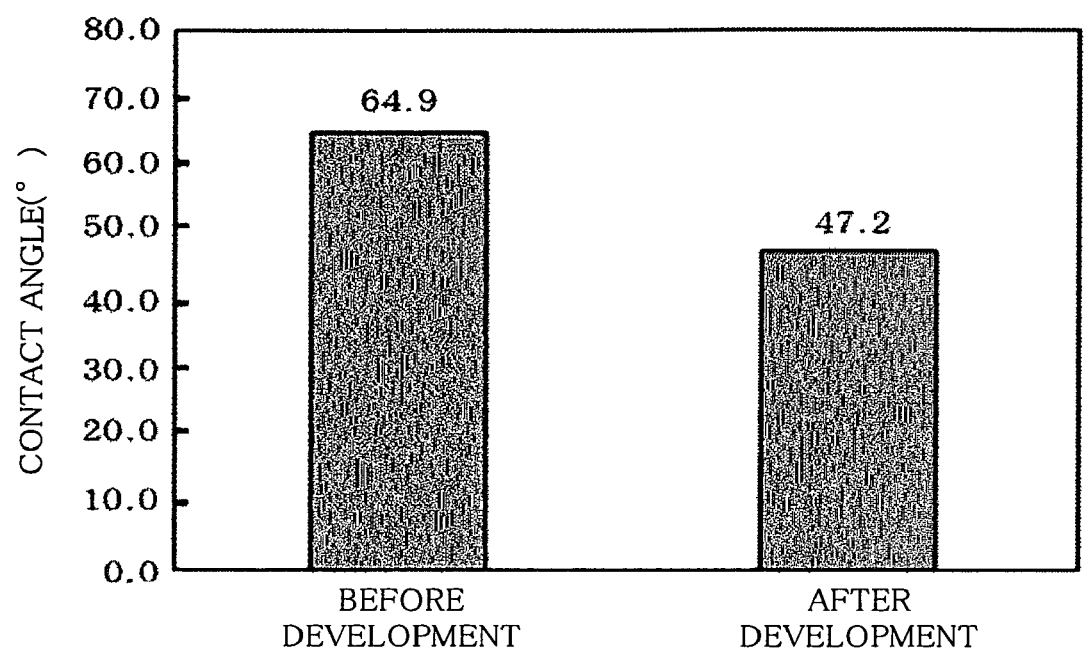
FIG. 15 is a graph showing results of a reference test.
Figure 16A:
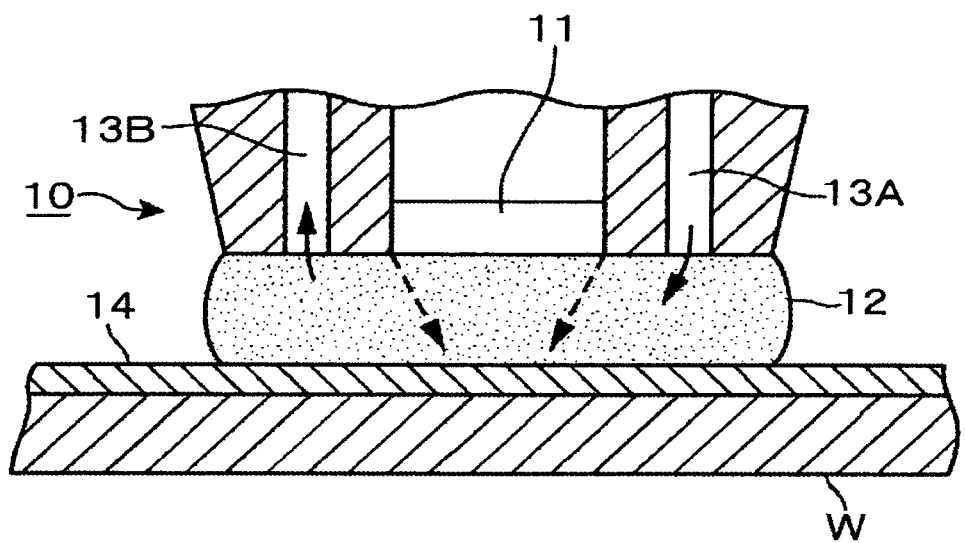
FIGS. 16A and 16B are explanatory views showing liquid-immersion exposure, FIG. 16A showing a state in which a solution film is formed between an exposure lens and a wafer, and FIG. 16B showing a state in which an exposure device is moved in a lateral direction.
Figure 16B:
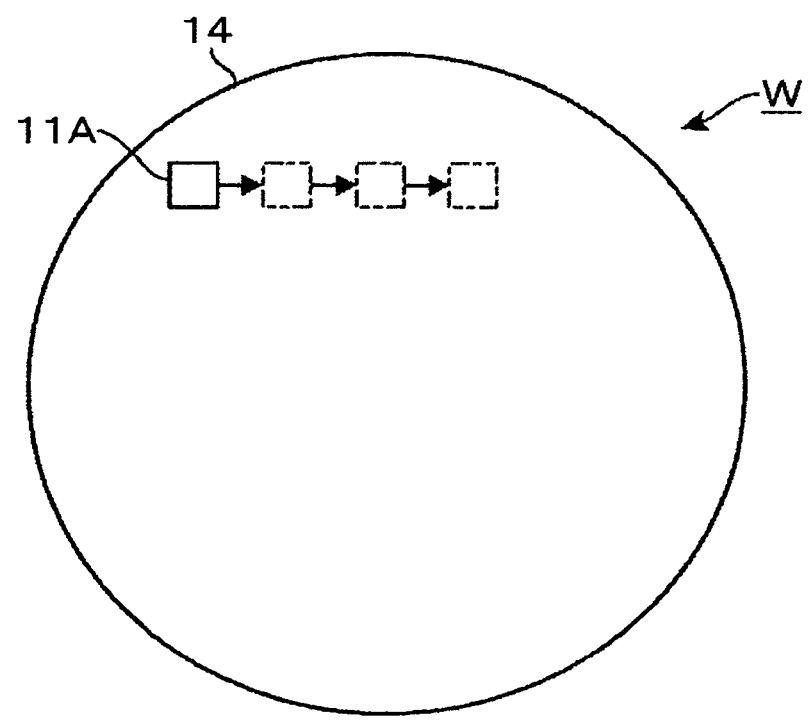
Figure 17:
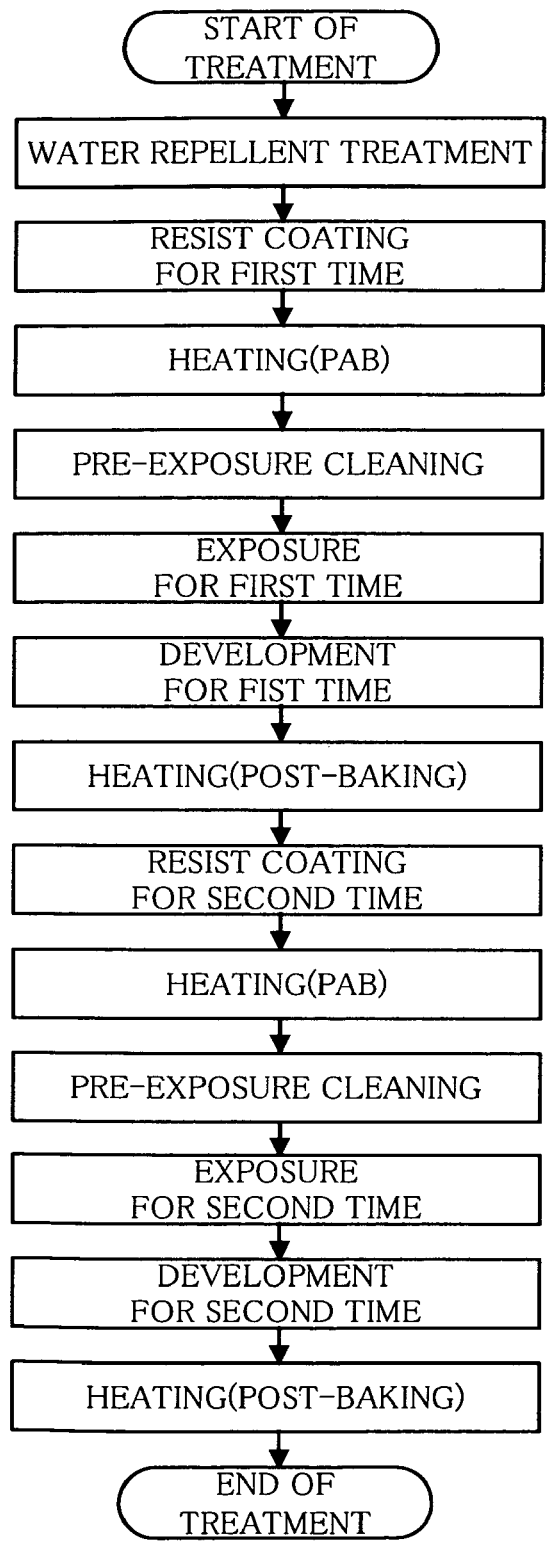
FIG. 17 is a flowchart showing a treatment process in a coating and developing apparatus for performing conventional double patterning.
Figure 18A:
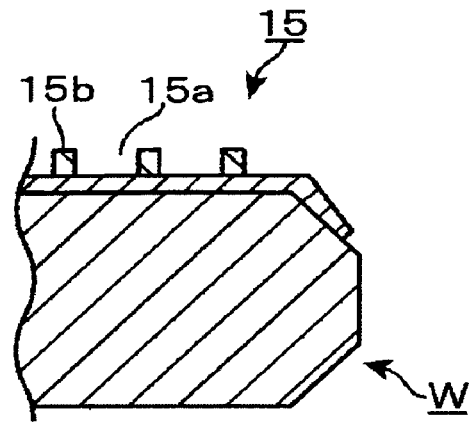
FIG. 18A and FIG. 18B are schematic views of a pattern formed by the double patterning, FIG. 18A showing a state in which a resist pattern is formed by a developing treatment for the first time, and FIG. 18B showing a state in which a resist pattern is formed by a developing treatment for the second time.
Figure 18B:
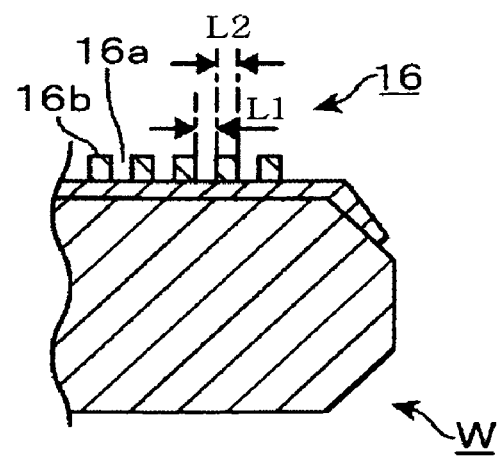
Figure 19A:
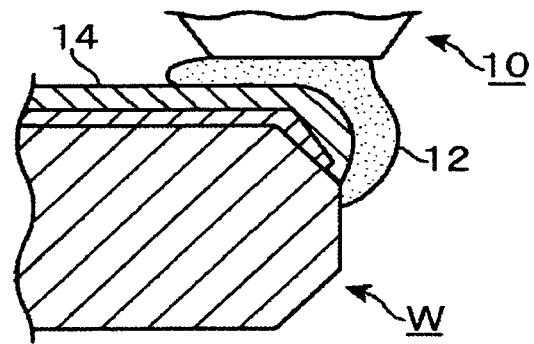
FIGS. 19A and 19B are explanatory views showing a peripheral edge portion of the wafer W during the liquid-immersion exposure in the double patterning, FIG. 19A showing an appearance in which liquid-immersion exposure for the first time is performed, and FIG. 19B showing an appearance in which liquid-immersion exposure for the second time is performed.
Figure 19B:
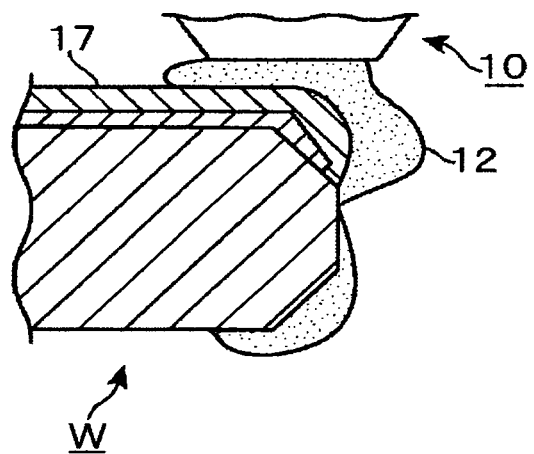

As has been briefly described in the Related Art, the contact angle was measured before a substrate which had been treated with the HMDS gas supplied to the entire wafer W was developed and after the substrate was developed. FIG. 15 shows the results at that time, and the contact angle of the wafer W was 64.9° before the development, whereas it decreased to 47.2° after the development. Accordingly, it is effective to perform water repellent treatment on the bevel portion of the wafer W after the developing treatment for the first time and before the liquid-immersion exposure for the second time as shown in the above-described embodiments.

What is claimed is:

1. A coating and developing method of forming a resist pattern a plurality of times in succession on a substrate, comprising the steps of:
    performing water repellent treatment at least on a side surface portion of a substrate;
    performing a first resist coating of applying a resist on an entire surface of the substrate;
    performing a first development of supplying a developing solution to the substrate on which a first liquid-immersion exposure has been further performed after the water repellent treatment and the first resist coating;
    performing a second resist coating of applying a resist to the entire surface of the substrate after the first development;
    performing a second development of supplying a developing solution to the substrate on which a second liquid-immersion exposure has been further performed after the second resist coating; and
    performing water repellent treatment on the side surface portion of the substrate after the first development and before the second liquid-immersion exposure is performed.

2. The coating and developing method as set forth in claim 1, further comprising the steps of:
   mounting, on a heating plate, the substrate after the first development and before the second resist coating; and
   heating the substrate,
   wherein said step of performing water repellent treatment on a side surface portion of a substrate comprises a step of supplying, to the side surface portion of the substrate while the substrate is being heated, a gas for performing water repellent treatment on the side surface portion.

3. The coating and developing method as set forth in claim 1, further comprising the steps of:
   mounting, on a heating plate, the substrate after the second resist coating and before the second liquid-immersion exposure is performed; and
   heating the substrate,
   wherein said step of performing water repellent treatment on a side surface portion of a substrate comprises a step of supplying, to the side surface portion of the substrate while the substrate is being heated, a gas for performing water repellent treatment on the side surface portion.

4. The coating and developing method as set forth in claim 1, further comprising the steps of:
   mounting, on a mounting table, the substrate after the second resist coating and before the second liquid-immersion exposure is performed; and
   supplying a cleaning solution to the substrate mounted on the mounting table to clean the substrate,
   wherein said step of performing water repellent treatment on a side surface portion of a substrate comprises a step of supplying, to the side surface portion of the substrate mounted on the mounting table, a chemical for performing water repellent treatment on the side surface portion.

* * * * *